(12) United States Patent
Tseng

(10) Patent No.: US 6,376,885 B1
(45) Date of Patent: Apr. 23, 2002

(54) SEMICONDUCTOR STRUCTURE WITH METAL SILICIDE AND METHOD FOR FABRICATED THE STRUCTURE

(75) Inventor: Horng-Huei Tseng, Hsinchu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/670,210

(22) Filed: Sep. 25, 2000

(51) Int. Cl.[7] .............................................. H01L 29/72
(52) U.S. Cl. ..................... 257/382; 257/288; 257/384; 257/388; 257/401; 257/412; 257/754; 257/773; 438/197; 438/683; 438/694
(58) Field of Search ................................ 257/288, 382, 257/754, 773, 384, 388, 401, 412; 438/197, 683, 694

(56) References Cited

U.S. PATENT DOCUMENTS 6,093,967 A * 7/2000 Liu et al. ..................... 257/288

\* cited by examiner

Primary Examiner—Edward Wojciechowicz
(74) Attorney, Agent, or Firm—J. C. Patents

(57) ABSTRACT

A method is directed to form a semiconductor device with silicide formed by a metal layer associated with a deposited silicon layer by providing a substrate. A field oxide layer is formed on a substrate to define an active region. A gate structure is formed on the active region, where the gate structure has a gate oxide layer, a gate layer, and a cap layer on the gate layer. The field oxide layer has a height substantially equal to the cap layer. A spacer is formed on a sidewall of the gate structure. The cap layer is removed to expose the gate layer, whereby a trench is formed. A silicon layer is deposited over the substrate. A refractory metal layer is deposited on the silicon layer. A silicide layer is formed by performing a thermal process to trigger a reaction between the silicon layer and the metal layer. The silicide layer is polished by CMP process using the field oxide layer as a polishing stop. As a result, the silicide fills the trench above the gate layer and the cavity between the spacer and the field oxide layer.

20 Claims, 2 Drawing Sheets

SEMICONDUCTOR STRUCTURE WITH METAL SILICIDE AND METHOD FOR FABRICATED THE STRUCTURE

BACKGROUND OF THE INVENTION

1. Field of Invention

The present invention relates to semiconductor fabrication. More particularly, the present invention relates to a method for forming a semiconductor device with a metal silicide which is formed by a metal layer associating with a deposited silicon layer.

2. Description of Related Art

As well known in the prior skills, a silicide layer can effectively reduce resistance of a conductive structure. The silicide in the conventional manner is formed by performing a thermal process, so as to trigger a reaction between a refractory metal material and a silicon layer. The refractory metal materials can be, for example, titanium, cobalt, tungsten. The silicon usually is provided by the silicon elements themselves, such as the silicon substrate or the polysilicon gate themselves. The results from this conventional manner usually consumes thickness of the silicon elements, particularly such as the source/drain junction depth. If the junction depth is insufficient, the MOS transistor would have poor performance. Also and, the silicide cannot have precise and sufficient thickness on the gate layer, so as to effectively improve conductivity. A conventional method to form a self-aligned silicide contacts formed from deposited silicon is disclosed in U.S. Pat. No. 6,093,967. However, only silicide formed on the junction region.

SUMMARY OF THE INVENTION

The invention provides a method for forming a semiconductor device with a metal silicide which is formed by a metal layer associating with a deposited silicon layer. The method includes first providing a substrate. A field oxide layer is formed on the substrate to define an active region. A gate structure is formed on the active region, where the gate structure has a gate oxide layer, a gate layer, and a cap layer on the gate layer. The field oxide layer has a height substantially equal to the cap layer. A spacer is formed on a sidewall of the gate structure. The cap layer is removed to expose the gate layer, whereby a trench is formed abutting the spacer. A silicon layer is deposited over the substrate. A refractory metal layer is deposited on the silicon layer. A silicide layer is formed by performing a thermal process to trigger reaction between the silicon layer and the refractory metal layer. The silicide layer is polished by a CMP process using the field oxide layer as a polishing stop. As a result, the silicide layer fills the trench above the gate layer and the cavity between the spacer and the field oxide layer.

In the foregoing, the silicide layer is formed under the self-aligned manner. The silicide layer is formed through the reaction between the refractory metal layer and the deposited silicon layer. In this manner, the silicide layer does not consume the junction depth. Moreover, the silicide is also planarized by CMP to have a height substantially equal to the filed oxide layer, where the cap layer is removed to leave the trench on the gate layer, and the silicide fills the trench on the gate layer. This can effectively reduce the conductivity of the gate with sufficient thickness by precisely controlling the thickness of the cap layer. The silicide is formed by CMP using the field oxide layer as the polishing stop, whereby a planarized surface is also naturally achieved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The present invention is directed to a formation of a self-aligned silicide on a semiconductor device, such as a metal-oxide semiconductor (MOS) transistor. The method allows a cap layer on the gate layer to be removed and replaced with a silicide with precise thickness. The silicide also fills the cavity space between the spacer and the field oxide layer, so that the silicide layer is also formed on the source/drain region of the MOS transistor with sufficient thickness without consuming the junction depth. In order to achieve the above features, a chemical mechanical polishing (CMP) process is also employed to planarize the silicide layer. In the following, an example is provided for descriptions.

FIGS. 1A–1E are cross-sectional views, schematically illustrating the process to form a self-aligned silicide layer on a semiconductor device, according to one preferred embodiment of this invention.

Figure 1A:
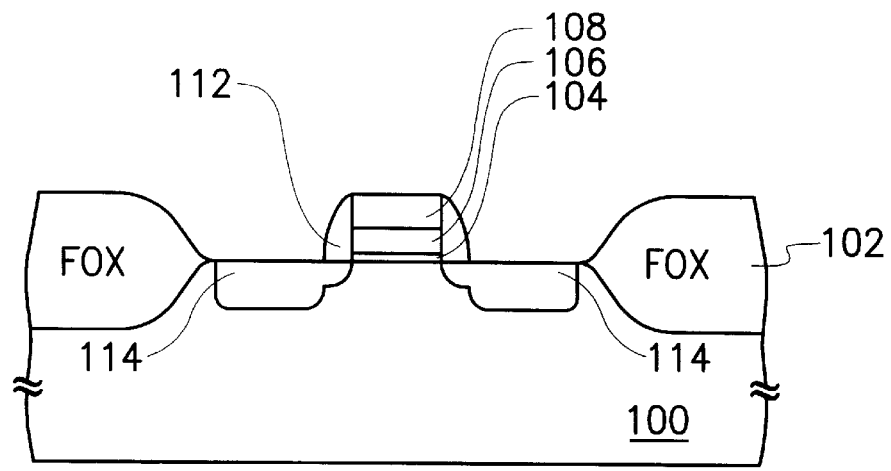
FIGS. 1A–1E are cross-sectional views, schematically illustrating the process to form a self-aligned silicide layer on a semiconductor device, according to one preferred embodiment of this invention.

In FIG. 1A, a gate structure is formed at an active region on a substrate. This structure can be formed by a few of steps. First, a substrate 100 is provided. A field oxide (FOX) layer 102 is formed on the substrate 100 to define the active region. A typical gate structure is formed on the substrate at the active region. The gate structure includes a gate oxide layer 104 on the substrate 100, a gate layer 106 on the gate oxide layer 104, and a cap layer 108 on the gate layer 106. The gate oxide layer usually is about 50–300 angstroms, the gate layer 106 usually is about 300–2000 angstroms, and the cap layer 108 usually is about 200–1500 angstroms. The gate layer 106 usually includes, for example, polysilicon and the cap layer 108 usually includes, for example, silicon nitride layer. Usually, a spacer 112 is formed on a sidewall of the gate structure. A source/drain region 114 with a doped extension region under the spacer 112 is also formed in the substrate 100 at each side of the gate structure. The spacer 112 can be formed by depositing a dielectric layer with a thickness of about 300–2500 angstroms, and etching back the dielectric layer to expose the cap layer. The material of the spacer 112 is chosen to be different the material of the cap layer 108. Preferable, the spacer 112 include silicon oxide.

It should be noted that the cap layer 108 has a height substantially equal to the FOX layer 102. This can be done by, for example, depositing the gate oxide layer 104, the gate layer 106, and the cap layer 108 in a blanket deposition manner. Before pattering them to form the gate structure, a CMP process is performed to have the FOX layer 102 and the cap layer 108 with about the same height. The cap layer 108 includes material different from the FOX layer 102. Preferably, the cap layer 108 includes silicon nitride. The spacer 112 includes also silicon oxide different from the material of the cap layer 108. The height of the FOX layer 102 can serve as a polishing stop of the device when a self-aligned silicide is formed and polished as to be depicted later. A cavity space between the spacer 112 and the FOX layer 102 is naturally formed after the MOS transistor is formed. The structure as shown in FIG. 1A can be achieved by various manners. The foregoing manner is only an example.

Figure 1B:
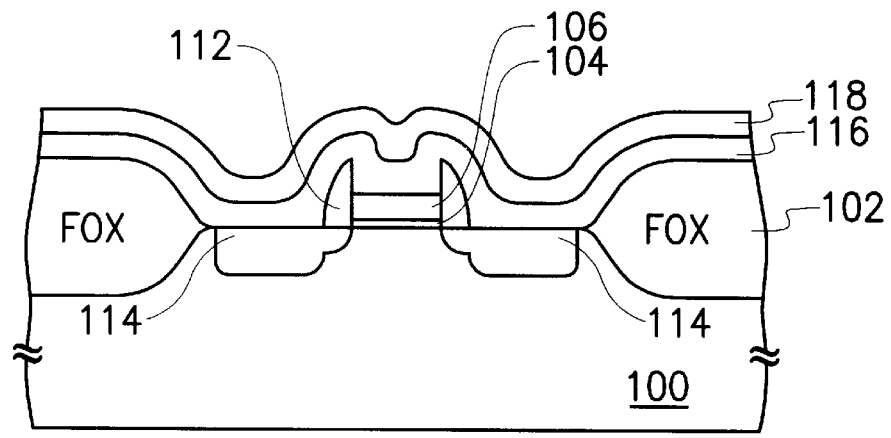

In FIG. 1B, the cap layer 108 is removed by, for example, wet etching. Since the material of the cap layer 108 is different from the spacer 112 and the FOX layer 102, the etching selectivity can be easily set. After the cap layer 108 is removed to form a trench between the spacer, the trench exposes the gate layer 106. Then, a blanket silicon layer 116 is formed over the substrate 100. The silicon layer generally is a layer rich of silicon material. The silicon layer 116 can include, for example, polysilicon, amorphous silicon, or silicon by ion-metal plasma (IMP) process. A refractory metal layer 118 is deposited on the silicon layer 116 by, for example, chemical deposition (CVD) or IMP process. The IMP process, like a sputtering deposition, is to respectively ionize a silicon material or a refractory-metal material to silicon or metal ions, and the ions are biased to anisotropically deposit over the substrate. The refractory metal layer 118 includes, for example, tungsten, titanium, or cobalt. A thermal process with a temperature of, for example, 600–1000 is performed so as to trigger a reaction between the silicon layer 116 and the refractory metal layer 118.

Figure 1C:
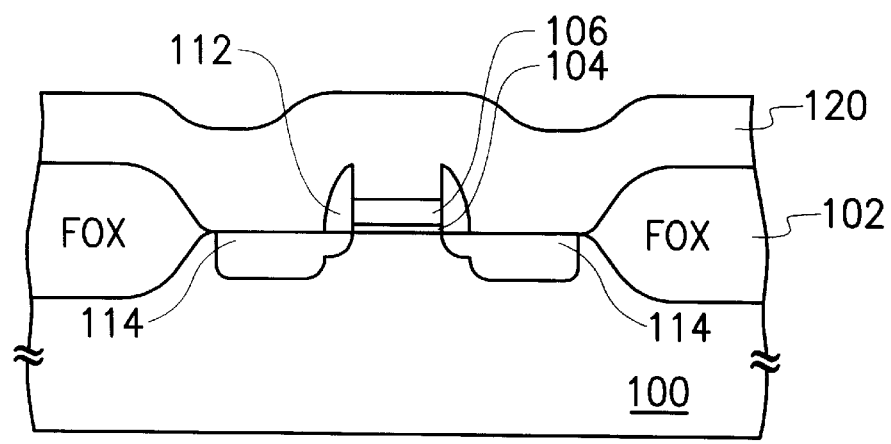

In FIG. 1C, after the thermal process, the silicon layer 116 and the refractor metal layer 118 react into a silicide layer 120. Since there is no need of alignment. This manner is also called a self-aligned manner. Due to a control of thickness on the silicon layer 116 and the refractory metal layer 118, the silicide layer 120 fills the trench on the gate layer 106 and the cavity space between the spacer 112 and the FOX layer 102. The trench is the space originally occupied by the cap layer 108 in FIG. 1A.

Figure 1D:
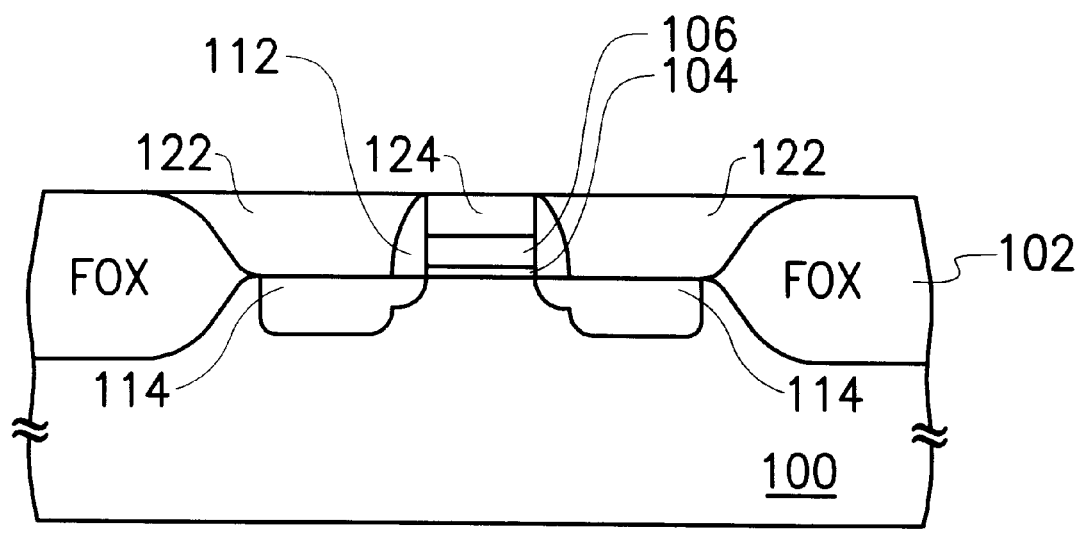

In FIG. 1D, the silicide layer 120 is polished by a CMP process, using the FOX layer 102 as a polishing stop. As a result, the remaining portion of the silicide layer 120 becomes a silicide layer 122 filling the cavity, and the silicide layer 124 fills the trench. If there is any refractory metal layer which has not reacted with the silicon layer, that portion can also be etched away by a proper etching selectivity. Now, the silicide layer has a height, substantially equal to the height of the FOX layer due to the CMP process. In this manner, the silicide layer 124 is formed on the gate layer to effectively increase the conductivity. The thickness of the silicide layer 124 can be well controlled by controlling the thickness of the cap layer 108, which originally formed on the gate layer as shown in FIG. 1A. Moreover, the silicide layer 122 can serve as a contact structure to have connection to the source/drain region 114 in FIG. 1A. The silicide contact can have better conductivity than a usual contact formed by pure metallic material. The silicide layers 122, 124 also do not consume the silicon elements, such as the polysilicon gate 106 and particularly the source/drain region 114.

Figure 1E:
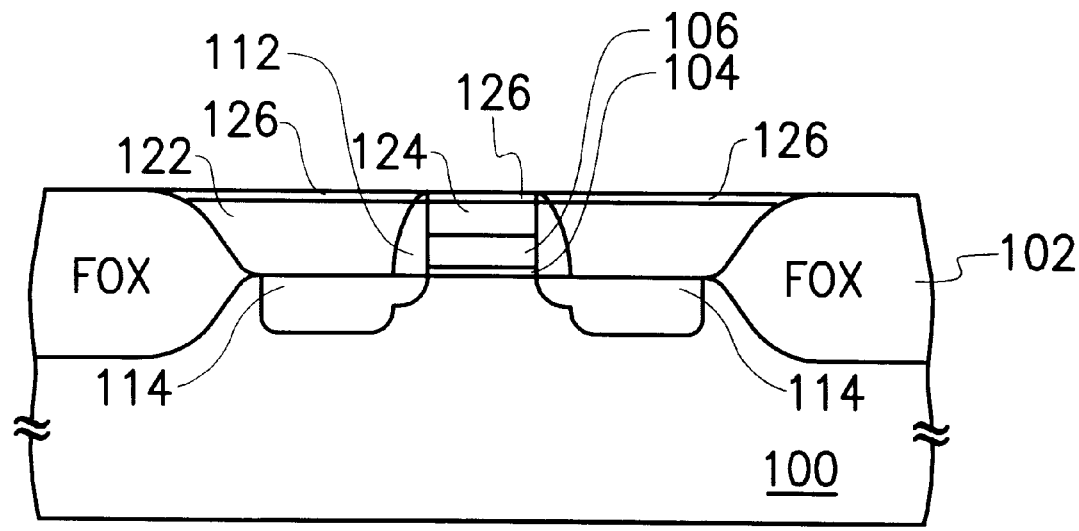

In FIG. 1E, if a well separation between the silicide layer 124 and the silicide layer 122 is desired, it preferably can be achieved by performing over polishing. However, this a design choice. Further still, a nitride layer 126, such as a titanium nitride layer, can optionally be formed on the silicide layers 122, 124 by putting the substrate 100 in a nitrogen-containing ambient under a thermal treatment. As a result, the refractory metal nitride layer 126 is formed on top of the silicide layers 122, 124.

In summary, the invention has several features as follows:

1. The invention uses the cap layer 108 to reserve a trench space, which can filled with silicide. The silicide on the gate can have sufficient thickness to effectively reduce the resistance without consume the polysilicon material of the gate.

2. Through the CMP process using the FOX layer as a polishing stop, the cap layer can have a height substantially equal to the FOX layer, so that the FOX can be used as a polishing stop when the silicide layer is polished.

3. The silicide layer is formed by depositing a silicon layer over the substrate to fill the trench space a and the cavity space. After CMP polishing, the silicide layer has a height about equal to the FOX layer.

4. Through the proper choice of the materials for the cap layer 108 and the spacer 112 associating with the field oxide layer 102, the desired etching selectivity can be easily achieved.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming a semiconductor device, the method comprising:

providing a substrate, on which there is a field oxide (FOX) layer to define out an active region;

forming a metal-oxide semiconductor (MOS) device on the substrate at the active region, wherein the MOS transistor includes a gate structure with a spacer on its sidewall, and a source/drain region in the substrate at each side of the gate structure, the gate structure has a gate oxide layer on the substrate, a gate layer on the gate oxide layer, and a cap layer on the gate layer, wherein the cap layer and the FOX layer have about the same height;

removing the cap layer to form a trench space on the gate layer between the spacer;

forming a blanket silicon layer over the substrate;

forming a refractory metal layer on the silicon layer;

performing a first thermal treatment to trigger a reaction between the silicon layer and the refractory metal layer, whereby a silicide layer is formed thereon; and polishing the silicide layer, using the FOX layer as a polishing stop, so that a remaining portion of the silicide layer includes a first silicide layer on the gate layer filling the trench space, and a second silicide layer on the source/drain region filling a space between the spacer and the FOX layer.

2. The method of claim 1, wherein the cap layer comprises a material different from that of the spacer and the FOX layer.

3. The method of claim 1, wherein the cap layer comprises silicon nitride.

4. The method of claim 1, wherein the spacer layer comprises silicon oxide.

5. The method of claim 1, wherein the step of forming the MOS device on the substrate comprises:

sequentially forming a preliminary gate oxide layer, a preliminary gate layer, and a preliminary cap layer over the substrate;

polishing materials over the substrate, whereby the preliminary cap layer and the FOX layer have about the same height;

patterning the preliminary gate oxide layer, the preliminary gate layer, and the preliminary cap layer to form the gate structure; and forming the spacer on the sidewall of the gate structure and the source/drain region in the substrate at each side of the gate structure.

6. The method of claim 1, wherein the gate oxide layer comprises a thickness of about 50–300 angstroms.

7. The method of claim 1, wherein the gate layer comprises a thickness of about 300–2000 angstroms.

8. The method of claim 1, wherein the cap layer comprises a thickness of about 200–1500 angstroms.

9. The method of claim 1, wherein the step of performing the first thermal treatment comprises an operation temperature of about 600° C.–1000° C.

10. The method of claim 1, further comprising a second thermal treatment under a nitrogen-containing ambient, whereby a refractory-metal nitride layer is formed on the first silicide layer and the second silicide layer.

11. The method of claim 1, wherein the silicon layer comprises one selected from a group consisting of polysilicon, amorphous silicon, and ion-metal plasma (IMP) silicon.

12. The method of claim 1, wherein the step of forming the refractory metal layer comprises one selected from a group consisting of titanium, cobalt, and tungsten.

13. The method of claim 1, wherein the step of forming the refractory metal layer comprises one selected from a group consisting of chemical vapor deposition and ion-metal plasma (IMP) process.

14. The method of claim 1, further comprising removing un-reacted portion of the refractory metal layer by choosing a proper etching selectivity.

15. The method of claim 1, wherein the step of polishing the silicide further layer comprises an over polishing to expose the spacer.

16. A semiconductor structure, comprising:

a substrate;

a field oxide (FOX) layer on the substrate to define out an active region;

a metal-oxide semiconductor (MOS) device on the substrate at the active region, wherein the MOS transistor includes a gate structure with a spacer on its sidewall, and a source/drain region in the substrate at each side of the gate structure, the gate structure comprises a gate oxide layer on the substrate, a gate layer on the gate oxide layer, and a first silicide layer filling a space between the spacers on the gate layer, wherein the first silicide layer and the FOX layer have about the same height; and a second silicide layer filling a space between the spacer and the FOX layer, wherein the first silicide layer and the second silicide layer have the same height.

17. The structure of claim 16, wherein the first silicide layer and the second silicide layer comprises refractory-metal silicide.

18. The structure of claim 16, further comprises a refractory-metal nitride layer on top of the first silicide layer and the second silicide layer.

19. A semiconductor structure, comprising:

a substrate;

a semiconductor device on the substrate, which has a silicide layer on top;

a spacer formed on a sidewall of the semiconductor device, wherein the spacer forms a trench space to expose the semiconductor device;

a first silicide layer filling the trench between the spacer; and a second silicide layer surrounding the gate structure and the spacer, wherein the first silicide layer and the second silicide layer have about the same height and are separated by the spacer.

20. The semiconductor structure of claim 19, further comprising a refractory-metal nitride layer on top of the first silicide layer and the second silicide layer.

* * * * *